United States Patent
Chen et al.

(10) Patent No.: US 7,560,222 B2
(45) Date of Patent: Jul. 14, 2009

(54) SI-CONTAINING POLYMERS FOR NANO-PATTERN DEVICE FABRICATION

(75) Inventors: Kuang-Jung Chen, Poughkeepsie, NY (US); Wu-Song Huang, Poughkeepsie, NY (US); Wai-Kin Li, Beacon, NY (US); Yi-Hsiung S. Lin, Taipei (TW)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 11/554,877

(22) Filed: Oct. 31, 2006

(65) Prior Publication Data

US 2008/0102401 A1     May 1, 2008

(51) Int. Cl.
G03F 7/36        (2006.01)
G03F 7/34        (2006.01)

(52) U.S. Cl. .................. 430/317; 430/313; 430/316; 430/311; 430/323; 430/325; 430/326

(58) Field of Classification Search .................. None
See application file for complete search history.

(56) References Cited

U.S. PATENT DOCUMENTS

| | | | |
|---|---|---|---|
| 5,484,867 | A | 1/1996 | Lichtenhan et al. |
| 6,420,084 | B1 | 7/2002 | Angelopoulos et al. |
| 6,911,518 | B2 | 6/2005 | Lichtenhan et al. |
| 6,994,946 | B2 | 2/2006 | Hatakeyama et al. |
| 2004/0053162 | A1* | 3/2004 | Uenishi et al. ............ 430/270.1 |
| 2004/0229158 | A1 | 11/2004 | Meador et al. |
| 2005/0167838 | A1 | 8/2005 | Edelstein et al. |
| 2005/0208752 | A1 | 9/2005 | Colburn et al. |
| 2005/0272341 | A1 | 12/2005 | Colburn et al. |
| 2006/0166128 | A1 | 7/2006 | Gogolides et al. |
| 2006/0231525 | A1 | 10/2006 | Asakawa et al. |
| 2006/0240355 | A1 | 10/2006 | Ando |
| 2007/0082297 | A1* | 4/2007 | Choi et al. ................... 430/311 |

OTHER PUBLICATIONS

Zhang, et al., "Simulations of Organic-tethered Silsesquioxane Nanocube Assemblies," Mater. Res. Soc. Symp. Proc., 2005 EE13.12.1-EE13.12.5, vol. 847.

* cited by examiner

Primary Examiner—Sin J. Lee
(74) Attorney, Agent, or Firm—Scully, Scott, Murphy & Presser, P.C.; Steven Capella, Esq.

(57) ABSTRACT

A resist polymer that has nano-scale patterns located therein that are in the form of sub lithographic hollow pores (or openings) that are oriented in a direction that is substantially perpendicular with that of its major surfaces (top and bottom) is provided. Such a resist polymer having the nano-scale patterns is used as an etch mask transferring nano-scale patterns to an underlying substrate such as, for example, dielectric material. After the transferring of the nano-scale patterns into the substrate, nano-scale voids (or openings) having a width of less than 50 nm are created in the substrate. The presence of the nano-scale voids in a dielectric material lowers the dielectric constant, k, of the original dielectric material. In accordance with an aspect of the present invention, the inventive resist polymer comprises a copolymer that includes a first monomer unit (A) that contains a Si-containing component, and a second monomer unit (B) that contains an organic component, wherein said two monomer units (A and B) have different etch rates.

1 Claim, 2 Drawing Sheets

SI-CONTAINING POLYMERS FOR NANO-PATTERN DEVICE FABRICATION

FIELD OF THE INVENTION

The present invention relates to semiconductor device manufacturing, and more particularly to a method for manufacturing sub lithographic openings in a Si-containing material, which material is then subsequently used as an etch mask for transferring the sub lithographic openings to an underlying dielectric material. The presence of the sub lithographic openings in the dielectric material lowers the overall dielectric constant of the dielectric material.

BACKGROUND OF THE INVENTION

To fabricate microelectronic semiconductor devices such as an integrated circuit (IC), many different layers of metal and insulation are selectively deposited on a semiconductor. The insulation layers may be, for example, silicon dioxide, silicon oxynitride, fluorinated silicate glass (FSG) and the like. These insulation layers are deposited between the metal layers, i.e., interlevel dielectric (ILD) layers, and may act as electrical insulation therebetween or serve other known functions.

The metal layers of such semiconductor devices are interconnected by metallization through vias etched in the intervening insulation layers. Additionally, interconnects are provided separately within the dielectric (e.g., insulation) layers. To accomplish this, the stacked layers of metal and insulation undergo photolithographic processing to provide a pattern consistent with a predetermined IC design. By way of example, the top layer of the structure may be covered with a photoresist layer of photo-reactive polymeric material for patterning via a mask. A photolithographic process using either visible or ultraviolet light is then directed through the mask onto the photoresist layer to expose it in the mask pattern. An antireflective coating (ARC) layer may be provided at the top portion of the wafer substrate to minimize reflection of light back to the photo resist layer for more uniform processing. The etching may be performed by anisotropic or isotropic etching as well as wet or dry etching, depending on the physical and chemical characteristics of the materials. Regardless of the fabrication process, to maximize the integration of the device components in very large scale integration (VLSI), it is necessary to increase the density of the components.

Although silicon dioxide has been used as an insulating material due to its thermal stability and mechanical strength, in recent years it has been found that improved device performance may be achieved by using a lower dielectric constant dielectric material. By using a lower dielectric constant insulator material, a reduction in the capacitance of the structure can be achieved which, in turn, increases the device speed. However, use of organic low-k dielectric materials such as, for example, SiLK® (manufactured by Dow Chemical Co., Midland, Mich.) tend to have lower mechanical strength than conventional dielectric materials such as, for example, silicon oxide.

By building a device having a low-k dielectric that is less than silicon dioxide, the large intra-level line-to-line component of wiring capacitive coupling is reduced, thus maximizing the positive benefit of the low-k material while improving the overall robustness and reliability of the finished structure. Even with prior art low dielectric constant materials including, for example, a hybrid oxide/low-k dielectric stack structure, there is still the possibility to improve even further the electrical properties of the device by lowering the effective k ($k_{eff}$) of a multilevel structure or a k of the dielectric material by forming voided channels within the dielectric material between the interconnects and vias. The channels are vacuum filled and have a dielectric constant of about 1. By using such channels, a higher dielectric constant dielectric material, itself, may be used to increase the overall strength of the structure without reducing the electric properties.

In known systems, sub-resolution (below 50 nm) lithographic processes have been used to create such channels. This typically consists of new manufacturing processes and tool sets which add to the overall cost of the fabrication of the semiconductor device. Also, in sub-resolution lithographic processes, it is necessary to etch wide troughs in empty spaces which, in turn, cannot be pinched off by ILD PECVD deposition. Additionally, although the channels create low line-line capacitance, there remains a high level-level capacitance for wide lines. This, of course, affects the overall electrical properties of the device. Also, air gaps can occur near the vias from a higher level, which create the risk of plating bath or metal fill at these areas. Lastly, in known processes, there is also the requirement of providing an isotropic etch which may etch underneath the interconnect thus leaving it unsupported or floating and, thus degrading the entire structural and electrical performance of the device.

SUMMARY OF THE INVENTION

The present invention solves the above and other problems by creating a resist polymer that has nano-scale patterns located therein that are in the form of sub lithographic hollow pores (or openings) that are oriented in a direction that is substantially perpendicular with that of its major surfaces (top and bottom). Such a resist polymer having the nano-scale patterns is used as an etch mask for transferring the nano-scale patterns to an underlying substrate, such as for example, a dielectric material. After transferring the nano-scale patterns into the substrate, nano-scale voids (or openings) having a width of less than 50 nm are created in the substrate. The presence of the nano-scale voids (or openings) in a dielectric material lowers the dielectric constant, k, of the original dielectric material.

In accordance with an aspect of the present invention, the inventive resist polymer comprises a copolymer film that includes a first monomer unit (A) that contains a Si-containing component, and a second monomer unit (B) that contains an organic component, wherein said two monomer units (A and B) have different etch rates. In particular, the first monomer unit A of the inventive resist polymer has a relatively higher etch rate in a fluorine-based etchant as compared to that of the second monomer unit B and thus the first monomer unit A which includes the Si-containing component can be removed by selective etching forming nano-scale patterns within the resist polymer.

The first monomer unit of the inventive resist polymer is an organic monomer grafted with a silsesquioxane. The organic monomer of the first monomer unit may be the same or different monomer as that of the organic component of the second monomer unit. Typically, the first monomer unit is an acrylate grafted with a silsesquioxane.

The organic component of the second monomer unit (B) as well as the organic monomer of the first monomer unit (A) may comprise one of the following monomers: acrylate, methacrylate, substituted or unsubstituted styrenes, vinyl anthracenes, vinyl naphthalenes, vinyl naphthols and vinyl phenols.

In some embodiments of the present invention, the second monomer unit (B) including the organic component can be modified to include an acid liable functional group such as, for example, t-butyl carbonate, t-alkyl esters, acetals and ketals.

In a highly preferred embodiment of the present invention, the resist polymer includes as the first monomer unit (A) an acrylate grafted with a silsesquioxane, while the second monomer unit (B) comprises vinyl phenol.

In another aspect of the present invention, the etched resist polymer of the present invention containing the nano-scale patterns can be used as an nano-scale etch mask for nano-device applications.

The inventive etched resist polymer containing the nano-scale patterns can be used as a means to lower the dielectric constant of an underlying dielectric material by transferring the nano-scale patterns into the dielectric material via etching. The resultant etched dielectric material contains nano-scale voids (or openings) which lowers the dielectric constant of the material. In one embodiment the present invention, the dielectric material containing the nano-scale voids is an element of a semiconductor interconnect structure.

DETAILED DESCRIPTION OF THE INVENTION

The present invention, which provides a resist polymer that includes nano-scale patterns therein and the use thereof as an etch mask, will now be described in greater detail by referring to the following discussion and drawings that accompany the present application. It is noted that the drawings of the present application are provided for illustrative purposes and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, the present invention provides a resist polymer that has nano-scale patterns located therein that are in the form of sub lithographic hollow pores (or openings) that are oriented in a direction that is substantially perpendicular with that of its major surfaces (i.e., upper and lower surfaces). Such a resist polymer having the nano-scale patterns is used as an etch mask for transferring the nano-scale patterns to an underlying dielectric material or another material such as a semiconductor or conductive material. After transferring the nano-scale patterns into the dielectric material, nano-scale voids (or openings) having a width of less than 50 nm are created in the dielectric material. The presence of the nano-scale voids in the dielectric material lowers the dielectric constant, k, of the original dielectric material.

Figure 1A:
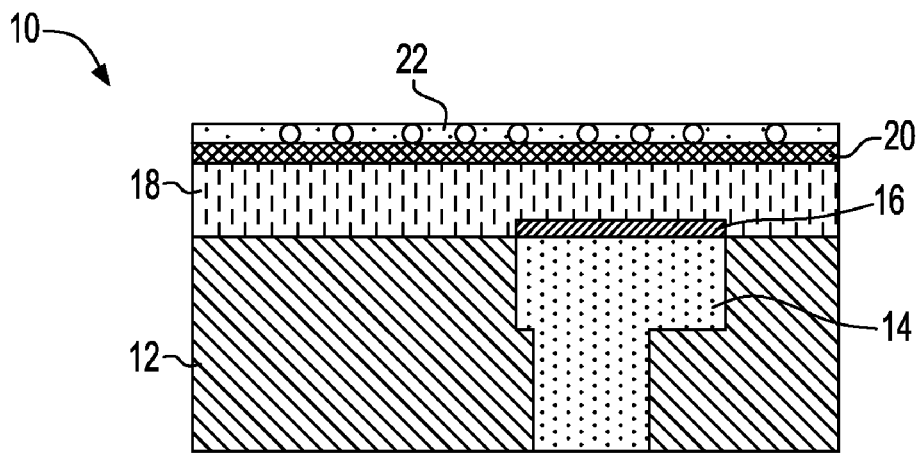
FIGS. 1A-1C are pictorial representations (through cross sectional views) illustrating one embodiment of the present invention.
Figure 1B:
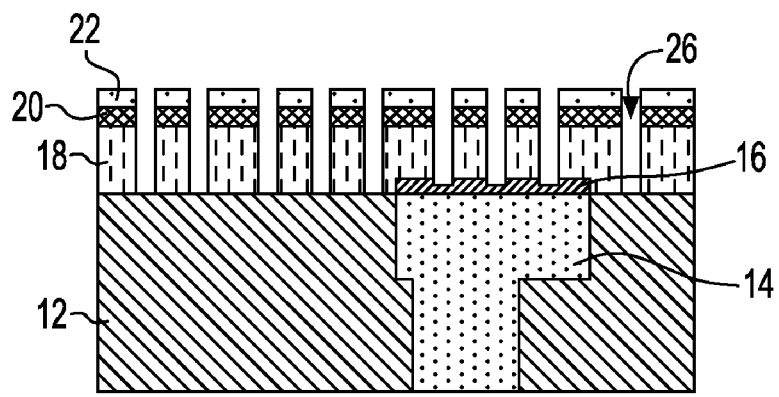
Figure 1C:
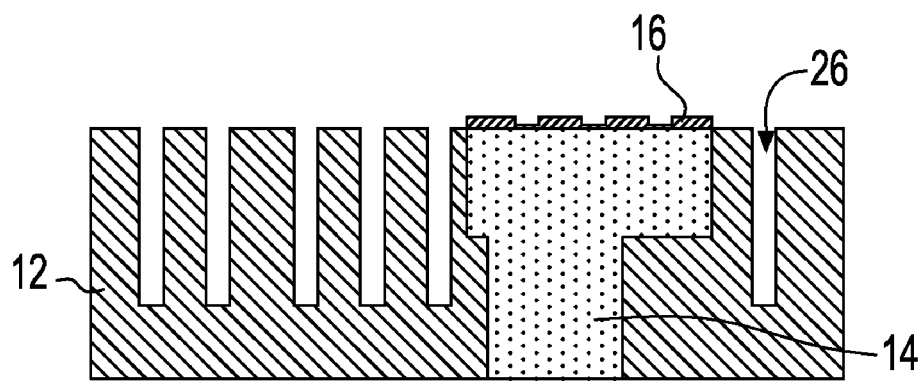

Reference is now made to FIGS. 1A-1C which illustrate the basic processing steps employed in one embodiment of the present invention in which the inventive resist polymer is used to lower the dielectric constant of an underlying dielectric material. This embodiment of the present invention begins by first providing the structure 10 shown in FIG. 1. As illustrated, the structure 10 includes a dielectric material 12 having a conductive feature 14 formed therein. The structure 10 also includes a selective barrier 16 located atop the uppermost surface of the conductive feature 14. The initial structure 10 also includes a stack comprising an organic underlayer 18 located atop the dielectric material 12 and the selective barrier 16, a hard mask 20 located atop the organic underlayer 18 and the inventive resist polymer 22 located atop the hard mask 20.

The structure 10 (minus the inventive resist polymer 22) is formed utilizing standard interconnect processing which is well known to those skilled in the art. For example, the structure 10 can be formed by applying the dielectric material 12 to a surface of a substrate (not shown). The substrate, which is not shown, may comprise a semiconducting material, an insulating material, a conductive material or any combination thereof.

The dielectric material 12 may comprise any interlevel or intralevel dielectric including inorganic dielectrics or organic dielectrics. The dielectric material 12 may be porous or non-porous. It should be emphasized that dielectric materials having pores formed therein at this point of the present invention are different from dielectric materials containing nano-scale openings that are formed after performing the inventive processing steps. The difference resides in the orientation of the pores. The inventive process provides nano-scale openings in the dielectric material that are oriented substantially perpendicular to the major surfaces of the dielectric material, while conventional porous dielectrics made using a porogen have pores that are randomly orientated.

Some examples of suitable dielectrics that can be used as the dielectric material 12 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 12 typically has an initial dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the dielectric material 12 may vary depending upon the dielectric material used as well as the exact number of dielectrics that make up the layer. Typically, and for normal interconnect structures, the dielectric material 12 has a thickness from about 200 to about 450 nm.

The dielectric material 12 has at least one conductive feature (line and/or via) 14 that is embedded (i.e., located within) therein. The conductive feature 14 is typically separated from the dielectric material 12 by a diffusion barrier layer (not specifically shown). The conductive feature 14 is formed by lithography (i.e., applying a photoresist to the surface of the dielectric material 12, exposing the photoresist to a desired pattern of radiation, and developing the exposed resist utilizing a conventional resist developer), etching (dry etching or wet etching) an opening in the dielectric material 12 and filling the etched region with a diffusion barrier layer and then with a conductive material forming the conductive feature 14. A single or dual damascene process can be used in forming the conductive feature.

The diffusion barrier layer, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. The thickness of the diffusion barrier layer may vary depending on the exact means of the deposition process as well as the material employed. Typically, the diffusion barrier layer has a thickness from about 4 to about 40 nm, with a thickness from about 7 to about 20 nm being more typical.

Following the diffusion barrier layer formation, the remaining region of the opening within the dielectric material 12 is filled with a conductive material forming the conductive feature 14. The conductive material used in forming the conductive feature 14 includes, for example, polySi, a conductive metal, an alloy comprising at least one conductive metal, a conductive metal silicide or combinations thereof. Preferably, the conductive material that is used in forming the conductive feature 14 is a conductive metal such as Cu, W or Al, with Cu or a Cu alloy (such as AlCu) being highly preferred in the present invention. The conductive material is filled into the remaining opening in the dielectric material 12 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the conductive feature 14 has an upper surface that is substantially coplanar with the upper surface of the dielectric material 12.

After forming the at least one conductive feature 14, the selective barrier 16 is formed on the exposed upper surface of the conductive feature 14 utilizing a selective deposition process such as, for example, electroplating. The selective barrier 16 comprises, for example, CoWP and/or CoSnP. The thickness of the selective barrier 16 may vary depending on the technique used to form the same as well as the material make-up of the layer. Typically, the selective barrier 16 has a thickness from about 30 to about 90 nm.

Next, the organic underlayer 18 is formed utilizing a conventional deposition process including, for example, CVD, PECVD, evaporation and spin-on coating. The organic underlayer 18 comprises any organic material including, for example, an antireflective coating material. The organic underlayer 18 typically, but not necessarily, has a thickness from about 30 to about 90 nm.

A hard mask 20, typically a nitride such as silicon nitride, is then formed on the organic underlayer 18. A thermal nitridation process can be used in forming the hard mask 20. Alternatively, the hard mask 20 can be formed by a conventional deposition process such as, for example, CVD or PECVD.

Next, the inventive resist polymer 22 is formed on the surface of the hard mask 20 utilizing a deposition process such as, dip coating, spin-on coating, brush coating or immersion. Following deposition of the inventive resist polymer 22, a drying step may be performed at a suitable temperature that dries the resist polymer. Typically, drying is performed at a temperature from about 60° to about 230° C. The drying step is typically performed in regular atmosphere or in an inert gas such as, for example, He, $N_2$ or Ar. Vacuum dry may be used instead or in conjunction with the drying technique mentioned above.

As stated above, the resist polymer 22 comprises a copolymer film that includes a first monomer unit (A) that contains a Si-containing component, and a second monomer unit (B) that contains an organic component, wherein said two monomer units (A and B) have different etch rates. Typically, the resist polymer includes from about 3 to about 70% of the first monomer unit A and from 30 to about 97% of the second monomer unit B.

The first monomer unit A of the inventive resist polymer has a relatively higher etch rate as compared to that of the second monomer unit B and thus the first monomer unit A which includes the Si-containing component can be removed by selective etching forming nano-scale patterns within the resist polymer.

The first monomer unit of the inventive resist polymer is an organic monomer grafted with a silsesquioxane. The organic monomer of the first monomer unit may be the same or different monomer as that of the organic component of the second monomer unit. Typically, the first monomer unit is an acrylate grafted with a silsesquioxane.

The organic component of the second monomer unit (B) as well as the organic monomer of the first monomer unit (A) may comprise one of the following monomers: acrylate, methacrylate, substituted or unsubstituted styrenes, vinyl anthracenes, vinyl naphthalenes, vinyl naphthols and vinyl phenols. The substituents for the substituted styrenes include halogens, alkyl moieties, aryl moieties, or alkoxy moieties.

In some embodiments of the present invention, the second monomer unit (B) including the monomer component can be modified to include an acid liable functional group such as, for example, t-butyl carbonate, t-alkyl esters, acetals and ketals. Such an embodiment provides that certain portions of the resist polymer will be removed for reactive ion etch through the underlying layers in this removed portion. This modification is achieved by incorporating a photoacid generator, a quencher, a surfactant and a solvent to this resist polymer to form a photoresist composition, then subjecting this photoresist composition to spin coating, baking, patternwised exposure with radiation, bake and develop process. The photoacid generator, quencher, surfactant and solvent employed in this embodiment of the present invention are conventional in the resist art.

In a highly preferred embodiment of the present invention, the resist polymer includes as the first monomer unit (A) an acrylate grafted with a silsesquioxane, while the second monomer unit (B) comprises vinyl phenol. The preferred resist polymer has the following formula:

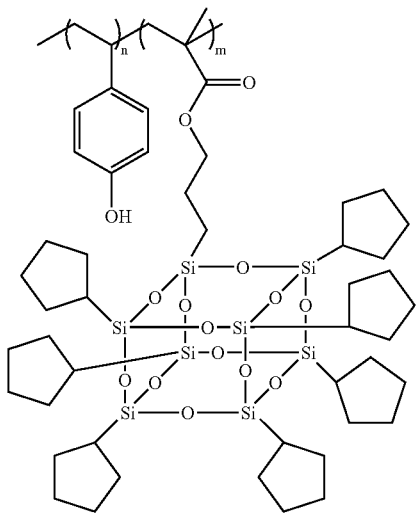

wherein n is from about 0.3 to about 0.97, more preferably from about 0.5 to about 0.96, and m is from about 0.03 to about 0.7, more preferably from about 0.04 to about 0.5.

The resist polymers of the invention preferably have a weight average molecular weight of at least about 2000, more preferably a weight average molecular weight from about 3000 to about 100,000.

The inventive resist polymer may be prepared by conventional polymerization techniques using commercially available and/or easily synthesized monomers. Typically, the inventive resist polymer is made in the presence of an organic solvent. Suitable organic solvents that can be used in forming the inventive resist polymer comprise tetrahydrofuran, ethanol, γ-butyrolactone, propylene glycol monomethyl ether acetate, cyclohexanone, dimethylacetamide, acetonitrile, ethyl acetate and ethyl lactate. Since conventional polymerization techniques can be employed, the inventive resist polymer can be readily and economically prepared in large scales.

The following represents one synthetic scheme that can be used in preparing the preferred resist polymer mentioned above; POSS stands for a polyhedral oligomeric silsesquioxane:

ferred. It is noted that after drying, the resist polymer has nano-scale patterns therein which are defined by the first monomer unit A.

As stated previously herein, the resist polymer includes monomer units that have different etch rates so that one can selectively remove one of the monomer units relative to the other. On one hand, the first monomer unit including the Si-containing component has a faster etch rate in a fluorine-based etchant such as, a $CF_4$ etchant, than the second monomer unit including the organic component. One the other hand, the second monomer unit has a faster etch rate in an oxygen-based etchant, such as an $O_2$ etchant, than the first monomer unit. The difference in etch rates of the first and second monomer units is an advantage over prior art copolymers since it allows for etching nano-patterns within the resist polymer 22.

In view of the above, the applicants of the present invention have determined that when the first monomer unit containing the Si-containing component is removed nano-sized (less

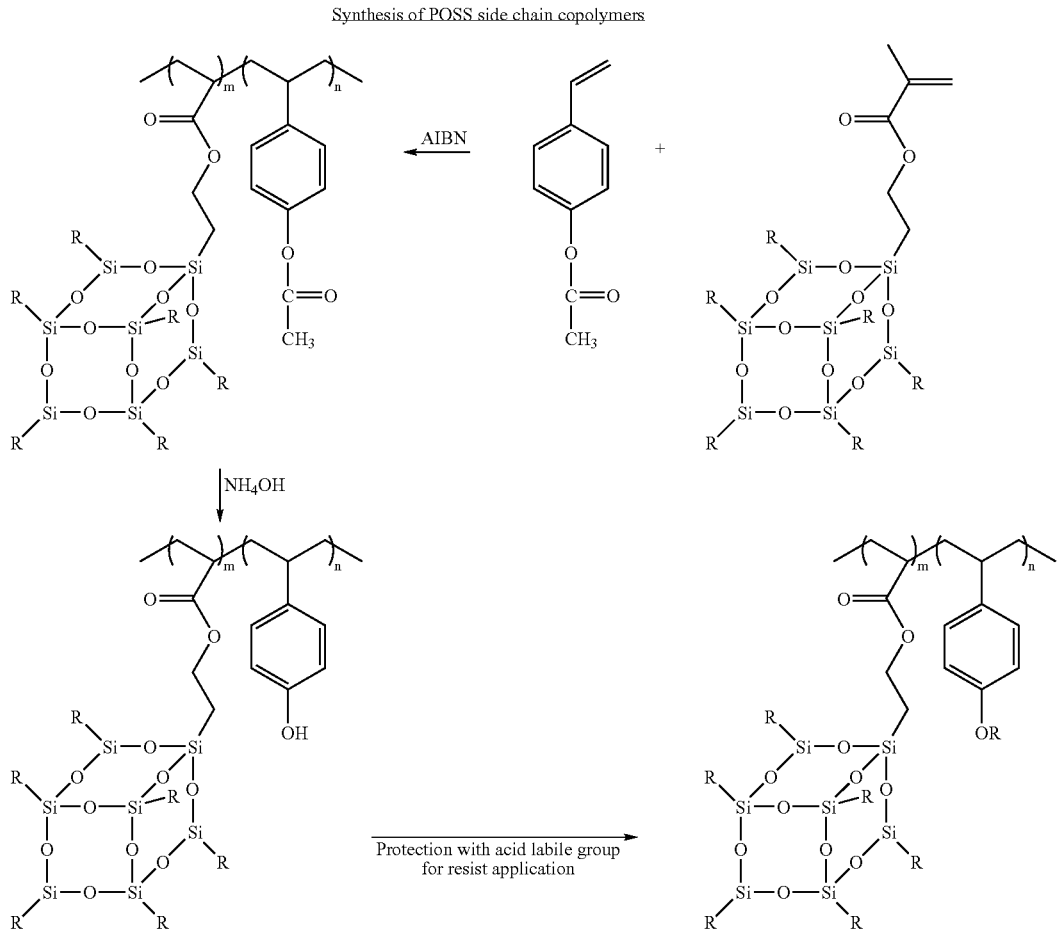

Synthesis of POSS side chain copolymers

In the above scheme, the R on the silsesquioxane moiety represents cyclopentane or other alkyl group, and n and m are as defined above. The R on the vinyl phenol after protection with an acid liable protecting group includes one of t-butyl carbonate, acetals and ketals.

The inventive resist polymer 22 has an as deposited thickness from about 10 to about 300 nm, with an as deposited thickness from about 15 to about 100 nm being more preferred.

than 50 nm) openings can be formed into the resist polymer 22 that are substantially perpendicular with the resist polymer's major surfaces (i.e., top and bottom surfaces).

Referring back to the drawings, and in particular FIG. 1B, there is shown the structure of FIG. 1A after etching through the resist polymer 22, the hard mask 20, the underlying organic layer 18 and portions of the barrier 16. The structure shown in FIG. 1B is obtained by first selectively etching the first monomer unit in a fluorine-based etchant, such as $CF_4$, from the resist polymer. As stated above, this forms the nano-sized openings in the resist polymer 22. A second etching step (wet or dry etching) that is selective for removing exposed portions of the hard mask 20 is then used to transfer the nano-sized openings of the etched resist polymer into the hard mask 20. A third etching process (wet or dry etching) that is selective for removing exposed portions of the organic underlayer 18 is then used to transfer the nano-sized openings from the etched hard mask 20 into the organic underlayer 18. During the third etching step, some portions of the barrier 16 may be removed as well. It is noted that in FIG. 1B, reference numeral 26 is used to denote the nano-scale openings (or voids) that are formed.

Reference is now made to FIG. 1C which shows the structure after another etching process is carried out to transfer the nano-scale openings 26 into the dielectric material 12 and subsequent removal of the remaining resist polymer 22, the hard mask 20 and the organic underlayer 18. It is noted that the conductive feature 14 is protected during this etch by the selective barrier 16. This etching which transfers the nano-scale opening into the dielectric material 12 comprises wet or dry etching that is selective for removing exposed portions of the dielectric material 12. A conventional resist stripping process can be used to remove the remaining resist polymer 22 from the structure. A planarization process such as chemical mechanical polishing (CMP) can be used to remove the hard mask 20 and the organic underlayer 18 from the structure.

At this point of the present invention, conventional interconnect processing can be performed on the structure shown in FIG. 1C. Since such processing is well known to those skilled in the art, no further details regarding the same are provided herein. It is however noted that the method of the present invention provides a dielectric material 12 that contains nano-scale openings 26 which are oriented substantially vertical (relative to the top and bottom surfaces) of the dielectric material 12. Because of the presence of the nano-scale openings 26 in the dielectric material 12, the dielectric material 12 has a lower dielectric constant than the original dielectric used in FIG. 1A. It is also worth pointing out that the nano-scale openings are typically vacuum filled.

Figure 2A:
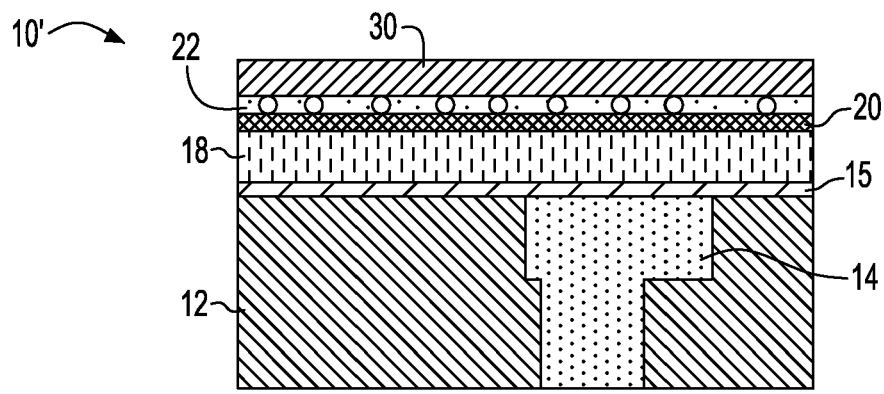
FIGS. 2A-2D are pictorial representations (through cross sectional views) illustrating another embodiment of the present invention.

Reference is now made to FIGS. 2A-2D which illustrate another embodiment of the present invention. This embodiment of the present invention includes the use of a photoresist material to protect pre-selected areas of the structure from receiving the nano-scale openings. FIG. 2A shows the initial structure 10' which is the same as that illustrated in FIG. 1A except for the presence of a dielectric cap layer 15 and a photoresist material 30 and the absence of the selective barrier 16.

In this embodiment, the dielectric cap 15, which is used instead of the selective barrier 16, is formed on an upper surface of the dielectric material 12 as well as the conductive feature 14 utilizing a conventional deposition process such as, for example, CVD, PECVD, chemical solution deposition, or evaporation. The dielectric cap 15 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the dielectric cap 15 may vary depending on the technique used to form the same as well as the material make-up of the layer. Typically, the dielectric cap 15 has a thickness from about 15 to about 55 nm, with a thickness from about 25 to about 45 nm being more typical.

The organic underlayer 18, the hard mask 20, and the inventive resist polymer 22 are then applied to the structure as described above. The photoresist material 30, which comprises a conventional resist material that is well known in the art, is then applied to the resist polymer 22. Any conventional process can be used in forming the photoresist material 30 atop the inventive resist polymer 22.

Figure 2B:
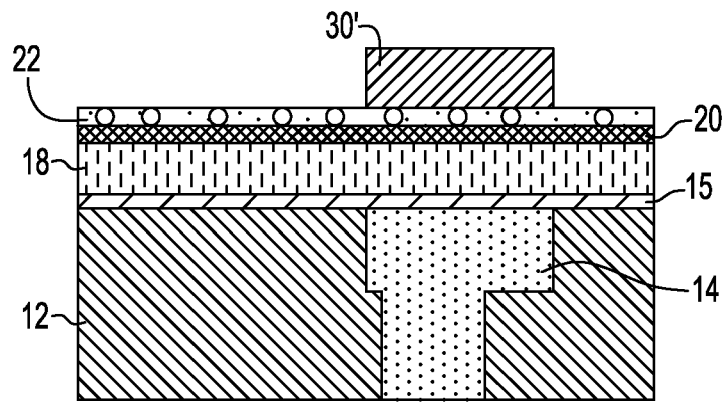

A lithographic step is then performed to pattern the photoresist material 30 into patterned resist 30' as is shown, for example, in FIG. 2B. The lithographic step includes exposing the photoresist material 30 to a desire pattern of radiation (or light) and developing the exposed photoresist material with a conventional resist developer.

Figure 2C:
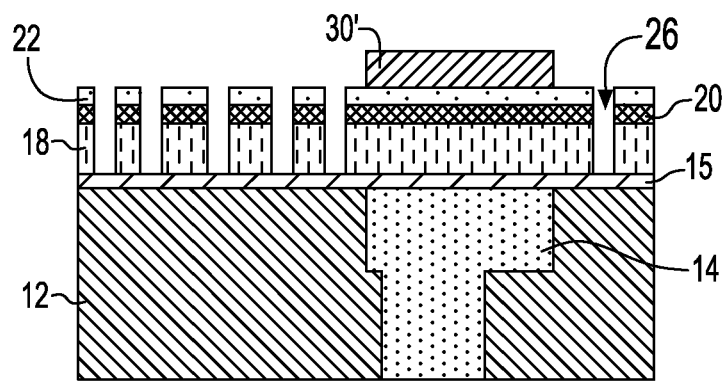

Next, and as shown for example, in FIG. 2C, the exposed portions of the resist polymer 22, the hard mask 20, the underlying organic layer 18 which are not protected by the patterned resist 30' are etched as described above. Specifically, the structure shown in FIG. 2C is obtained by first selectively etching the first monomer unit in $CF_4$ from the resist polymer. As stated above, this forms the nano-sized openings in the resist polymer. A second etching step (wet or dry etching) that is selected for removing exposed portions of the hard mask 20 is then used to transfer the nano-sized openings of the etched polymer resist into the hard mask 20. A third etching process (wet or dry etching) that is selective for removing exposed portions of the underlying organic layer 18 is then used to transfer the nano-sized openings from the etched hard mask 20 into the organic layer 18. It is noted that in FIG. 2C, reference numeral 26 is used to denote the nano-scale openings that are formed.

Figure 2D:
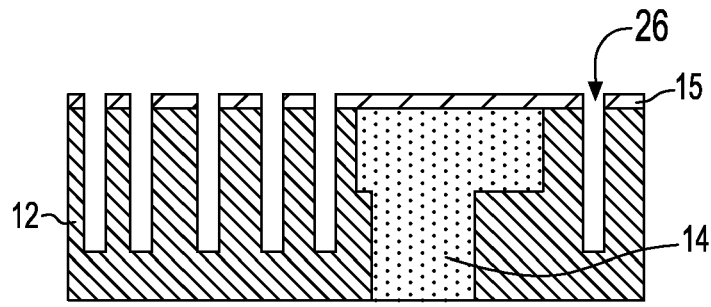

Reference is now made to FIG. 2D which shows the structure after an etching process is carried out to transfer the nano-scale openings 26 into the dielectric material 12 and subsequent removal of the remaining resist polymer 22, hard mask 20, and organic underlayer 18; during this etch, portions of the dielectric cap 15 are opened. It is noted that the conductive feature 14 is protected during this etch by patterned resist material 30' which is also removed from the structure after forming the nano-scale openings 26 into the dielectric material 12. This etching which transfers the nano-scale opening into the dielectric material 12 comprises wet or dry etching that is selective for removing exposed portions of the dielectric material 12. A conventional resist stripping process can be used to remove the remaining resist polymer 22 and the patterned resist material 30' from the structure. CMP or another like planarization process can be used to remove the remaining hard mask 20 and the organic underlayer 18 from the structure.

At this point of the present invention, conventional interconnect processing can be performed on the structure shown in FIG. 2D. Since such processing is well known to those skilled in the art, no further details regarding the same are provided herein. It is however noted that the method of the present invention provides a dielectric material 12 that contains nano-scale openings 26 which are oriented substantially vertical (relative to the top and bottom surfaces) of the dielectric material 12. Because of the presence of the nano-scale openings 26 in the dielectric material 12, the dielectric material 12 has a lower dielectric constant than the original dielectric used in FIG. 2D.

The following non-limiting examples are provided to further illustrate the present invention. Because the examples are provided for illustrative purposes only, the invention embodied therein should not be limited thereto.

EXAMPLE 1

Synthesis of a Copolymer of Hydroxystyrene and Methacryl-POSS (90/10) (Polymer A)

10 g of methacryl-POSS, 10.52 g hydroxystyrene and 0.64 g AIBN were dissolved in 40 g THF and charged into a 3-neck flask. The flask was purged with $N_2$ for 30 minutes before the temperature was raised to 62° C. The reaction was carried out overnight under $N_2$. On the next day, the solution was precipitated in 2000 ml of water. The solid thus formed was stirred in 500 ml of hexane, then was filtered off and thereafter washed with hexane. The fine powder polymer was collected and dried in vacuum overnight at 40° C. The molecular weight was determined by GPC to be Mw=12.4 K.

EXAMPLE 2

Synthesis of a Copolymer of Hydroxystyrene and Methacryl-POSS (95/5) (Polymer B)

7.5 g methacryl-POSS, 22.46 g acetoxystyrene and 1.44 g AIBN were dissolved in 120 g THF and charged into a 3-neck flask. The flask was purged with $N_2$ for 30 minutes before the temperature was raised to 60° C. The reaction was carried overnight under $N_2$. On the second day, the solution was precipitated in 2000 ml of water. The polymer was collected and dried in vacuum overnight at 40° C. The molecular weight was determined by GPC to be Mw=8.05 K.

One the second day, 26 g of the polymer, 240 ml methanol and 30 ml (30%) ammonia hydroxide were added to the flask and the temperature was kept at 62° C. The reaction was carried out overnight in $N_2$. On the third day, the solution remained blur. The solution was rotary evaporated dried to form a solid. The solid thus formed was washed with water, and then mixed in 200 ml THF, 100 ml methanol, and 20 ml of ammonium hydroxide. After overnight under reflux, the solution was precipitated in 2000 ml water and 20 ml acetic acid. The polymer was dried overnight at 40° C.

EXAMPLE 3

Creation of Nano-Scale Patterns with Circular Top Openings on the Polymers

Polymer A from Example 1 was dissolved in cyclohexanone to form 1.14 wt % and 0.5 wt % polymer solutions. Both solutions were spin coated on Si wafers using a spin speed of 1500 rpm, and then baked on hot plate at 110° C. for 90 sec to give thicknesses of about 35 nm and 20 nm, respectively. Both wafers were subjected to a reactive ion etching process using $CF_4$ as an etchant. The top down SEM images of etched wafers exhibited many circular holes with diameter around 20 nm. The 20 nm thick film exhibited higher density of holes than the 35 nm thick one. The same experiment was carried out on Polymer B obtained from Example 2 with 1 wt % and 0.5 wt % polymer solutions. The results of creating circular holes were very similar to those obtained on Polymer A.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of providing a nano-scale opening within a dielectric material comprising:

providing a structure which includes, from bottom to top, a dielectric material having at least one conductive feature embedded therein, an organic underlayer located atop said dielectric material, a hard mask located atop the organic underlayer and a copolymer film located on said hard mask, said copolymer film comprising a first monomer unit (A) that contains a Si-containing component, and a second monomer unit (B) that contains an organic component, wherein said two monomer units (A and B) have different etch rates and said copolymer film has the following structural formula:

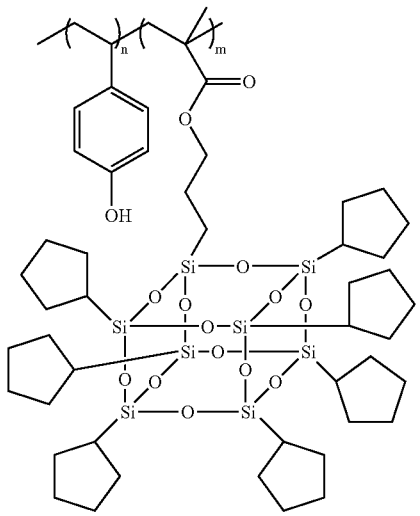

wherein n is from about 0.3 to about 0.97 and m is from about 0.03 to about 0.7;

selectively removing the first monomer unit from said copolymer film by selective etching thereby forming nano-scale openings in said copolymer film, said nano-scale openings are substantially perpendicular with upper and lower surfaces of said copolymer film; and transferring the nano-scale openings from said copolymer film to said dielectric material utilizing a selective etching process.

* * * * *